United States Patent
Tanitsu

(10) Patent No.: US 9,341,956 B2
(45) Date of Patent: May 17, 2016

(54) SPATIAL LIGHT MODULATOR UNIT, ILLUMINATION OPTICAL SYSTEM, EXPOSURE DEVICE, AND DEVICE MANUFACTURING METHOD

(75) Inventor: Osamu Tanitsu, Kumagaya (JP)

(73) Assignee: Nikon Corporation, Tokyo (JP)

( * ) Notice: Subject to any disclaimer, the term of this patent is extended or adjusted under 35 U.S.C. 154(b) by 885 days.

(21) Appl. No.: 13/348,990

(22) Filed: Jan. 12, 2012

(65) Prior Publication Data

US 2012/0178028 A1    Jul. 12, 2012

Related U.S. Application Data

(63) Continuation of application No. PCT/JP2010/072742, filed on Dec. 17, 2010.

(60) Provisional application No. 61/282,170, filed on Dec. 23, 2009.

(51) Int. Cl.
| | |
|---|---|
| G03B 27/52 | (2006.01) |
| G03F 7/20 | (2006.01) |
| G02B 26/08 | (2006.01) |

(52) U.S. Cl.
CPC ........ *G03F 7/70116* (2013.01); *G02B 26/0833* (2013.01)

(58) Field of Classification Search
CPC . G03F 7/702; G03F 7/70116; G03F 7/70075; G03F 7/70191; G03F 7/70216; G03F 7/70308; G03F 7/70066; G03F 7/70108; G03F 1/24; G03F 7/70058; G03F 7/70141; G03F 7/70158; G03F 7/70558

USPC ............................................. 355/30, 53, 67
See application file for complete search history.

(56) References Cited

U.S. PATENT DOCUMENTS

| | | |
|---|---|---|
| 5,312,513 A | 5/1994 | Florence et al. |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 7,095,546 B2 | 8/2006 | Mala et al. |
| 2004/0227922 A1* | 11/2004 | Dierichs et al. ............. 355/71 |
| 2005/0095749 A1 | 5/2005 | Krellmann et al. |
| 2007/0296936 A1 | 12/2007 | Kato et al. |

(Continued)

FOREIGN PATENT DOCUMENTS

| | | |
|---|---|---|
| EP | 0 779 530 A1 | 6/1997 |
| JP | 6-124873 A | 5/1994 |

(Continued)

*Primary Examiner* — Mesfin T Asfaw

(74) *Attorney, Agent, or Firm* — Shapiro, Gabor and Rosenberger, PLLC

(57) ABSTRACT

According to one embodiment, a spatial light modulator unit is used in the illumination optical system for illuminating an illumination target surface with light from a light source and comprises: a spatial light modulator with a plurality of optical elements arrayed in a predetermined plane and controlled individually; a spatial light modulation element which applies spatial light modulation to the incident light from the light source and which makes rays of intensity levels according to positions of the respective optical elements, incident on the plurality of optical elements; and a control unit which individually controls the plurality of optical elements on the basis of information about the intensity levels of the rays incident on the respective optical elements.

24 Claims, 10 Drawing Sheets

(56) References Cited

U.S. PATENT DOCUMENTS

| | | |
|---|---|---|
| 2008/0030707 A1 | 2/2008 | Tanaka et al. |
| 2008/0239268 A1* | 10/2008 | Mulder et al. .................. 355/67 |
| 2009/0073411 A1* | 3/2009 | Tanitsu ........................... 355/67 |
| 2009/0097094 A1 | 4/2009 | Tanaka |
| 2009/0115990 A1* | 5/2009 | Owa et al. ....................... 355/71 |
| 2009/0116093 A1 | 5/2009 | Tanitsu |
| 2009/0128886 A1* | 5/2009 | Hirota ........................... 359/291 |
| 2009/0135392 A1* | 5/2009 | Muramatsu ..................... 355/67 |

FOREIGN PATENT DOCUMENTS

| | | |
|---|---|---|
| JP | 10-303114 A | 11/1998 |
| JP | 2004-304135 A | 10/2004 |
| JP | 2006-113437 A | 4/2006 |
| WO | WO 99/49504 A1 | 9/1999 |

* cited by examiner

FROM CR

SPATIAL LIGHT MODULATOR UNIT, ILLUMINATION OPTICAL SYSTEM, EXPOSURE DEVICE, AND DEVICE MANUFACTURING METHOD

CROSS-REFERENCE TO RELATED APPLICATION

This application is a continuation application of PCT/JP2010/072742 claiming the benefit of priority of U.S. Provisional Application No. 61/282,170 filed on Dec. 23, 2009, the entire contents of which are incorporated herein by reference.

BACKGROUND

1. Field

One embodiment of the invention relates to a spatial light modulator unit, an illumination optical system, an exposure device, and a device manufacturing method.

2. Description of the Related Art

In a typical exposure device of this kind, a light beam outputted from a light source travels through a fly's eye lens as an optical integrator to form a secondary light source (in general, a predetermined light intensity distribution on an illumination pupil) as a substantial surface illuminant consisting of a large number of light sources. In the description hereinafter, the light intensity distribution on the illumination pupil will be referred to as "pupil intensity distribution." The illumination pupil is defined as a position such that an illumination target surface becomes a Fourier transform plane of the illumination pupil by action of an optical system between the illumination pupil and the illumination target surface (which is a mask or a wafer in the case of the exposure device).

Rays from the secondary light source are condensed by a condenser optical system to illuminate the mask with a predetermined pattern thereon in a superimposed manner. The light passing through the mask is focused through a projection optical system on the wafer and the mask pattern is projected and exposed (transferred) onto the wafer. Since the pattern formed on the mask is a highly integrated one, it is essential to obtain a uniform illuminance distribution on the wafer, in order to accurately transfer the fine pattern onto the wafer.

There is a conventionally proposed illumination optical system capable of continuously changing the pupil intensity distribution (and the illumination condition eventually) (cf. U.S. Patent Application Laid-Open No. 2009/0116093). The illumination optical system disclosed in U.S. Patent Application Laid-Open No. 2009/0116093 uses a movable multi-mirror system consisting of a large number of microscopic mirror elements arranged in an array form and individually driven and controlled in their inclination angle and inclination direction, to divide an incident beam into small unit rays by respective reflecting faces thereof and deflect the small unit rays, whereby the cross section of the beam is converted into a desired shape or a desired size, so as to realize a desired pupil intensity distribution.

SUMMARY

According to an embodiment, a spatial light modulator unit used in an illumination optical system for illuminating an illumination target surface with light from a light source, comprising:

a spatial light modulator with a plurality of optical elements arrayed in a predetermined plane and controlled individually;

a spatial light modulation element which applies spatial light modulation to the light incident from the light source and which makes rays of intensity levels according to positions of the respective optical elements, incident on the plurality of optical elements; and a control unit which individually controls the plurality of optical elements on the basis of information about the intensity levels of the rays incident on the respective optical elements.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings.

Figure 1:
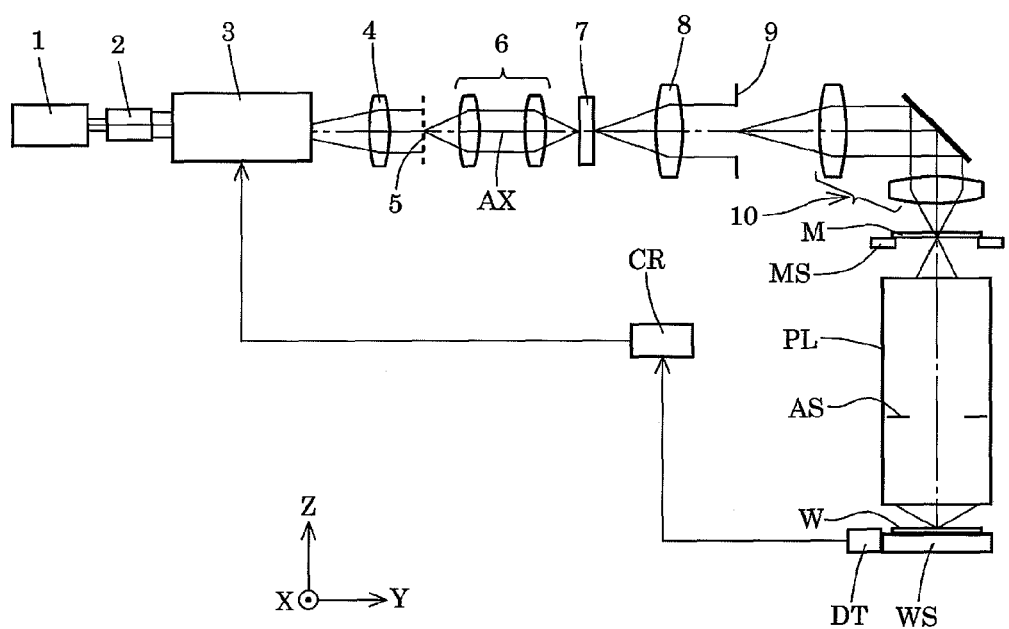
FIG. 1 is an exemplary drawing schematically showing a configuration of an exposure device according to an embodiment.
Figure 2:
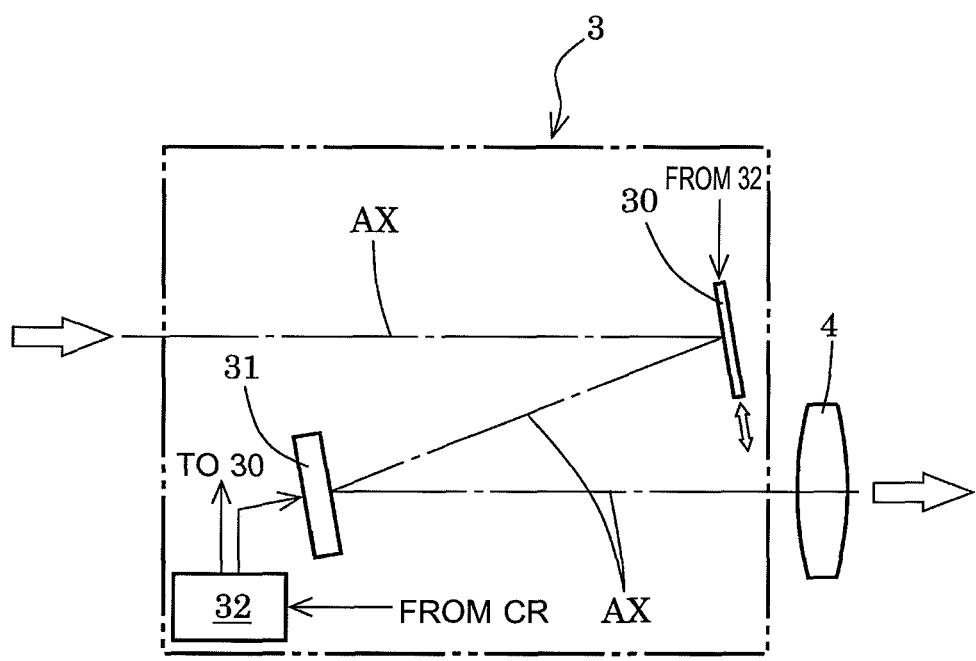
FIG. 2 is an exemplary drawing schematically showing an internal configuration of a spatial light modulator unit.
Figure 2:
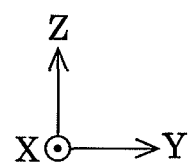

FIG. 1 is an exemplary drawing schematically showing a configuration of an exposure device according to an embodiment. FIG. 2 is an exemplary drawing schematically showing an internal configuration of a spatial light modulator unit shown in FIG. 1. In FIG. 1, the Z-axis is set along a direction of a normal to a transfer plane (exposed plane) of a wafer W being a photosensitive substrate, the Y-axis along a direction parallel to the plane of FIG. 1 in the transfer plane of the wafer W, and the X-axis along a direction normal to the plane of FIG. 1 in the transfer plane of the wafer W.

With reference to FIG. 1, exposure light (illumination light) is supplied from a light source 1 in the exposure device of the present embodiment. The light source 1 applicable herein is, for example, an ArF excimer laser light source to supply light at the wavelength of 193 nm, a KrF excimer laser light source to supply light at the wavelength of 248 nm, or the like. The light outputted from the light source 1 travels through a beam delivery unit 2 and a spatial light modulator unit 3 into a relay optical system 4. The beam delivery unit 2 functions to guide the incident beam from the light source 1 to the spatial light modulator unit 3, while converting the beam into an optical beam with a cross section of an appropriate size and shape, and to actively correct positional variation and angular variation of the beam incident into the spatial light modulator unit 3.

The spatial light modulator unit 3, as shown in FIG. 2, is provided with a reflection-type diffractive optical element 30 which applies spatial light modulation to the incident light from the light source 1 and which outputs the modulated light, a spatial light modulator 31 arranged in an optical path between the diffractive optical element 30 and the relay optical system 4, and a control unit 32 which individually controls a plurality of mirror elements in the spatial light modulator 31 on the basis of a control signal from a main control system CR. The diffractive optical element 30 is arranged so as to be optionally inserted into or retracted from an illumination optical path and so as to be replaceable with another reflection-type diffractive optical element (not shown) with a different diffraction property.

The spatial light modulator 31, as described below, has a plurality of mirror elements arrayed in a predetermined plane and controlled individually, and a driving unit which individually controls and drives postures of the mirror elements on the basis of a signal from the control unit 32. The control unit 32 controls switching of the diffractive optical elements relative to the illumination optical path, based on a control signal from the main control system CR. The switching of the diffractive optical elements can be implemented, for example, by a method such as the well-known turret method and slide method. The action of the diffractive optical element 30 and the configuration and action of the spatial light modulator 31 will be described later.

The light outputted from the spatial light modulator unit 3 travels through the relay optical system 4 as a Fourier transform optical system into a predetermined plane 5. Namely, the relay optical system 4 is so set that a front focal position thereof is approximately coincident with the position of the array plane of the mirror elements in the spatial light modulator 31 and that a rear focal position thereof is approximately coincident with the position of the predetermined plane 5. As described later, the light having traveled via the spatial light modulator 31 variably forms a light intensity distribution according to the postures of the mirror elements on the predetermined plane 5.

The light forming the light intensity distribution on the predetermined plane 5 travels through a relay optical system 6 to enter a micro fly's eye lens (or fly's eye lens) 7. The relay optical system 6 sets the predetermined plane 5 and an entrance plane of the micro fly's eye lens 7 in an optically conjugate relation. Therefore, the light having traveled via the spatial light modulator unit 3 forms a light intensity distribution corresponding to the light intensity distribution formed on the predetermined plane 5, on the entrance plane of the micro fly's eye lens 7 arranged at the position optically conjugate with the predetermined plane 5.

The micro fly's eye lens 7 is, for example, an optical element consisting of a large number of microscopic lenses with a positive refractive power which are arranged in a matrix in a plane and densely, and is constructed by forming the microscopic lens group by etching on a plane-parallel plate. In the micro fly's eye lens, unlike the fly's eye lens consisting of lens elements isolated from each other, the large number of microscopic lenses (microscopic refracting faces) are integrally formed without being isolated from each other. However, the micro fly's eye lens is an optical integrator of the same wavefront division type as the fly's eye lens in that the lens elements are arranged in a matrix on a plane.

The rectangular microscopic refracting faces as unit wavefront division faces in the micro fly's eye lens 7 have the rectangular shape similar to the shape of an illumination field to be formed on a mask M (and eventually similar to the shape of an exposure region to be formed on the wafer W). The micro fly's eye lens 7 applicable herein is, for example, a cylindrical micro fly's eye lens. The configuration and action of the cylindrical micro fly's eye lens are disclosed, for example, in U.S. Pat. No. 6,913,373.

The beam incident into the micro fly's eye lens 7 is two-dimensionally divided by the large number of microscopic lenses and a secondary light source with a light intensity distribution approximately identical to the light intensity distribution formed on the entrance plane (a substantial surface illuminant consisting of a large number of small light sources: pupil intensity distribution) is formed on a rear focal plane of the micro fly's eye lens 7 or on an illumination pupil near it. Rays from the secondary light source formed on the illumination pupil immediately behind the micro fly's eye lens 7 are incident on an illumination aperture stop (not shown). The illumination aperture stop is arranged at or near the rear focal plane of the micro fly's eye lens 7 and has an aperture (light transmitting portion) of the shape corresponding to the secondary light source.

The illumination aperture stop is configured so as to be optionally inserted into or retracted from the illumination optical path and so as to be replaceable with any one of aperture stops having respective apertures of different sizes and shapes. Switching of the illumination aperture stops can be implemented, for example, by a method such as the well-known turret method and slide method. The illumination aperture stop is arranged at the position approximately optically conjugate with an entrance pupil plane of a projection optical system PL described below, and defines the range of contribution of the secondary light source to illumination. It is also possible to omit the installation of the illumination aperture stop.

The rays from the secondary light source limited by the illumination aperture stop travel through a condenser optical system 8 to illuminate a mask blind 9 in a superimposed manner. In this way, a rectangular illumination field according to the shape and focal length of the rectangular microscopic refracting faces of the micro fly's eye lens 7 is formed on the mask blind 9 as an illumination field stop. Rays having passed through a rectangular aperture (light transmitting portion) of the mask blind 9 are subjected to condensing action of imaging optical system 10 and thereafter illuminate the mask M with a predetermined pattern thereon in a superimposed manner. Namely, the imaging optical system 10 forms an image of the rectangular aperture of the mask blind 9 on the mask M.

The light through the mask M held on a mask stage MS travels through the projection optical system PL to form an image of the mask pattern on the wafer (photosensitive substrate) W held on a wafer stage WS. In this way, the pattern of the mask M is sequentially exposed in each of exposure regions on the wafer W by one-shot exposure or by scan exposure, while two-dimensionally driving and controlling the wafer stage WS and therefore two-dimensionally driving and controlling the wafer W in the plane (XY plane) perpendicular to the optical axis AX of the projection optical system PL.

The exposure device of the present embodiment is provided with a pupil intensity distribution measuring unit DT which measures a pupil intensity distribution on a pupil plane of the projection optical system PL on the basis of the light having traveled through the projection optical system PL, and the main control system CR which controls the spatial light modulator unit 3 on the basis of the measurement result of the pupil intensity distribution measuring unit DT and which generally controls the operation of the exposure device. The pupil intensity distribution measuring unit DT is provided with a CCD imaging unit with an image pickup plane, for example, arranged at the position optically conjugate with the pupil position of the projection optical system PL, and monitors pupil intensity distributions about respective points on the image plane of the projection optical system PL (which are pupil intensity distributions formed at the pupil position of the projection optical system PL by rays incident on the respective points). The detailed configuration and action of the pupil intensity distribution measuring unit DT can be seen, for example, with reference to U.S. Patent Application Laid-Open No. 2008/0030707.

In the present embodiment, the mask M arranged on an illumination target surface of the illumination optical system (and, in turn, the wafer W) is illuminated by Köhler illumination, using the secondary light source formed by the micro fly's eye lens 7, as a light source. For this reason, the position where the secondary light source is formed is optically conjugate with the position of an aperture stop AS of the projection optical system PL and the plane where the secondary light source is formed can be called an illumination pupil plane of the illumination optical system. Typically, the illumination target surface (the plane where the mask M is arranged or the plane where the wafer W is arranged when the illumination optical system is considered to include the projection optical system PL) becomes an optical Fourier transform plane with respect to the illumination pupil plane. The pupil intensity distribution is a light intensity distribution (luminance distribution) on the illumination pupil plane of the illumination optical system or on a plane optically conjugate with the illumination pupil plane.

When the number of divisions of the wavefront by the micro fly's eye lens 7 is relatively large, there is a high correlation between the global light intensity distribution formed on the entrance plane of the micro fly's eye lens 7 and the global light intensity distribution (pupil intensity distribution) of the entire secondary light source. For this reason, the light intensity distributions on the entrance plane of the micro fly's eye lens 7 and on planes optically conjugate with the entrance plane can also be called pupil intensity distributions. In the configuration of FIG. 1, the relay optical systems 4, 6 and the micro fly's eye lens 7 constitute a distribution forming optical system which forms the pupil intensity distribution on the illumination pupil immediately behind the micro fly's eye lens 7 on the basis of the rays having traveled via the spatial light modulator 31 in the spatial light modulator unit 3.

Figure 3:
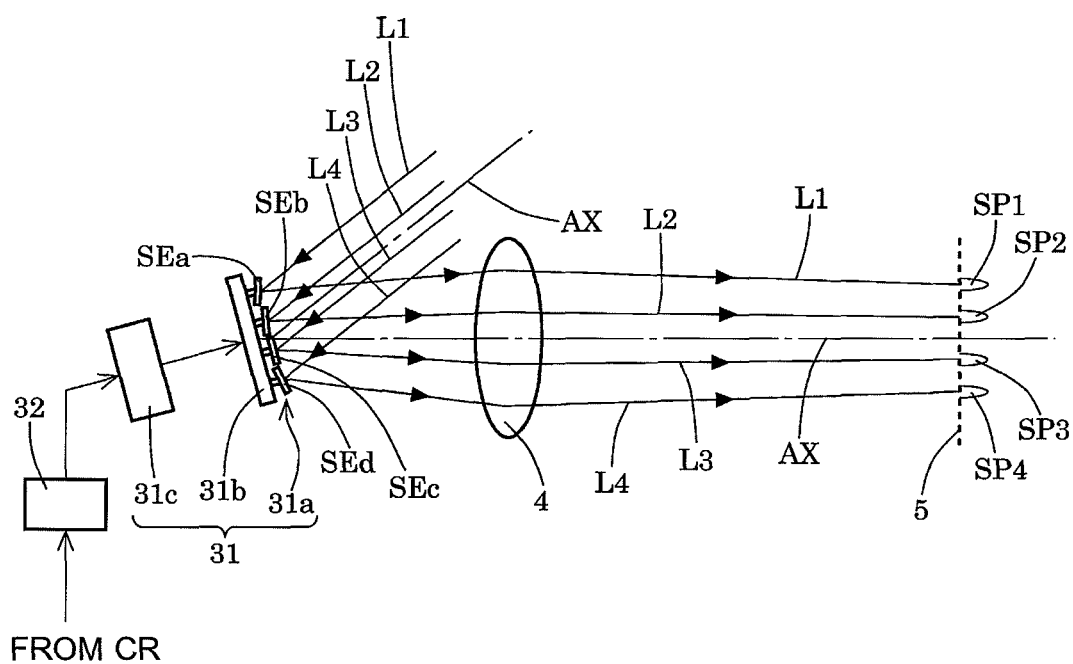
FIG. 3 is an exemplary drawing for explaining a configuration and action of a spatial light modulator in the spatial light modulator unit.

Next, the configuration and action of the spatial light modulator 31 in the spatial light modulator unit 3 will be specifically described. The spatial light modulator 31, as shown in FIG. 3, is provided with a plurality of mirror elements 31a arrayed in a predetermined plane, a base 31b holding the mirror elements 31a, and a driving unit 31c which individually controls and drives the postures of the mirror elements 31a through a cable (not shown) connected to the base 31b. In the spatial light modulator 31, the postures of the mirror elements 31a are changed each by action of the driving unit 31c operating based on a control signal output by the control unit 32 in accordance with a command from the main control system CR, whereby the mirror elements 31a are set in their respective predetermined orientations.

Figure 4:
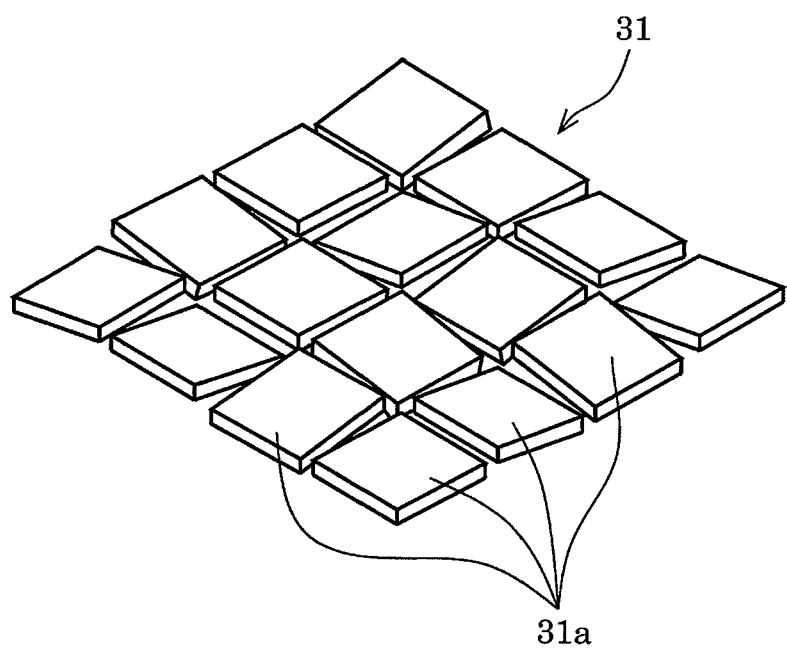
FIG. 4 is an exemplary partial perspective view of the major part of the spatial light modulator.

The spatial light modulator 31, as shown in FIG. 4, is provided with a plurality of microscopic mirror elements 31a arrayed two-dimensionally, and functions to variably apply spatial modulation according to the position of incidence of incident light, to the incident light and output the modulated light. For simplicity of description and illustration, FIGS. 3 and 4 show a configuration example in which the spatial light modulator 31 is provided with 4×4=16 mirror elements 31a, but in fact the spatial light modulator 31 is provided with much more mirror elements 31a than the sixteen elements.

With reference to FIG. 3, when a group of rays are incident on the spatial light modulator 31, a ray L1 is incident on the mirror element SEa out of the plurality of mirror elements 31a and a ray L2 is incident on the mirror element SEb different from the mirror element SEa. Similarly, a ray L3 is incident on the mirror element SEc different from the mirror elements SEa, SEb, and a ray L4 is incident on the mirror element SEd different from the mirror elements SEa-SEc. The mirror elements SEa-SEd apply respective spatial modulations set according to their positions, to the rays L1-L4.

When the spatial light modulator 31 is in a standard state in which the reflecting faces of all the mirror elements 31a are set along one plane, the spatial light modulator 31 is configured so that rays incident along the direction parallel to the optical axis AX of the optical path between the diffractive optical element 30 and the spatial light modulator 31 travel in directions approximately parallel to the optical axis AX of the optical path between the spatial light modulator 31 and the relay optical system 4, after reflected by the spatial light modulator 31. As described above, the array plane of the mirror elements 31a in the spatial light modulator 31 is positioned at or near the front focal position of the relay optical system 4.

Therefore, the rays with a predetermined angle distribution after reflected by the mirror elements SEa-SEd in the spatial light modulator 31 form predetermined light intensity distributions SP1-SP4 on the predetermined plane 5 and eventually form light intensity distributions corresponding to the light intensity distributions SP1-SP4 on the entrance plane of the micro fly's eye lens 7. Namely, the relay optical system 4 converts the angles given to the emerging rays by the mirror elements SEa-SEd in the spatial light modulator 31, into positions on the predetermined plane 5 being the far-field region (Fraunhofer diffraction region) of the spatial light modulator 31. In this manner, the light intensity distribution (pupil intensity distribution) of the secondary light source formed by the micro fly's eye lens 7 becomes a distribution corresponding to the light intensity distribution formed on the entrance plane of the micro fly's eye lens 7 by the spatial light modulator 31 and the relay optical systems 4, 6.

The spatial light modulator 31, as shown in FIG. 4, is a movable multi-mirror system including the mirror elements 31a being the large number of microscopic reflecting elements arrayed regularly and two-dimensionally along one plane in a state in which the planar reflecting faces are facing up. Each mirror element 31a is movable and an inclination of the reflecting face thereof, which is an angle and a direction of inclination of the reflecting face, is individually controlled by action of the driving unit 31c operating based on a control signal from the control unit 32. Each mirror element 31a can be rotated continuously or discretely by a desired angle of rotation around rotational axes along two directions parallel to the reflecting face and perpendicular to each other. Namely, the inclination of the reflecting face of each mirror element 31a can be controlled two-dimensionally.

In the case where the reflecting face of each mirror element 31a is discretely rotated, it is preferable to perform control to switch the angle of rotation in a plurality of states (e.g., . . . , −2.5°, −2.0°, . . . 0°, +0.5° . . . +2.5°, . . . ). FIG. 4 shows the mirror elements 31a with the contour of square shape, but the contour of the mirror elements 31a does not always have to be limited to the square shape. In terms of light utilization efficiency, however, the contour can be a shape permitting an array to minimize the clearance between the mirror elements 31a (i.e., a shape permitting a close-packed structure). In terms of light utilization efficiency, the spacing between two adjacent mirror elements 31a can be controlled to a necessary minimum value.

In the present embodiment, the spatial light modulator 31 employed is, for example, the spatial light modulator in which the orientations of the mirror elements 31a arrayed two-dimensionally are continuously changed. The spatial light modulator of this kind can be selected, for example, from those disclosed in European Patent Publication No. 779530, U.S. Pat. No. 6,900,915, U.S. Pat. No. 7,095,546, and Japanese Patent Application Laid-open No. 2006-113437. The orientations of the mirror elements 31a arrayed two-dimensionally may be controlled so as to have a plurality of discrete stages.

In the spatial light modulator 31, the postures of the mirror elements 31a are changed each by action of the driving unit 31c operating in accordance with a control signal from the control unit 32, whereby the mirror elements 31a are set in their respective predetermined orientations. The rays reflected at respective predetermined angles by the mirror elements 31a of the spatial light modulator 31 form a desired pupil intensity distribution on the illumination pupil immediately behind the micro fly's eye lens 7. Furthermore, a desired pupil intensity distribution is also formed at the position of another illumination pupil optically conjugate with the illumination pupil immediately behind the micro fly's eye lens 7, i.e., at the pupil position of the imaging optical system 10 and at the pupil position of the projection optical system PL (the position where the aperture stop AS is arranged).

Figure 5A:
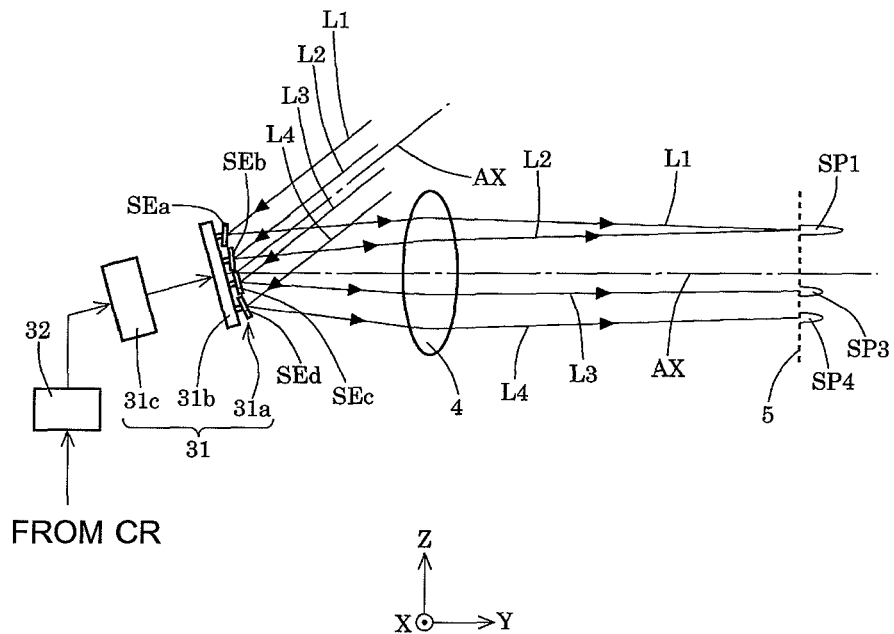
FIGS. 5A and 5B are exemplary drawings for explaining an action of a spatial light modulator in a configuration of a comparative example.
Figure 5B:
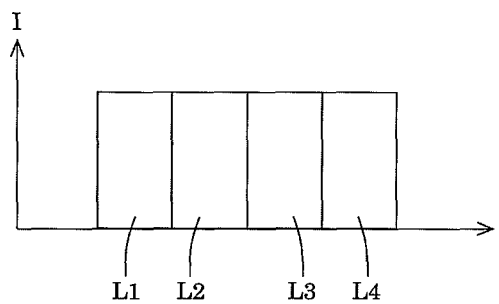

FIG. 5A is an exemplary drawing showing a state in which pupil intensity distributions with a plurality of intensity levels are formed on the predetermined plane 5 being the far-field region (Fraunhofer diffraction region) of the spatial light modulator 31, in a configuration of a comparative example in which the diffractive optical element 30 is excluded from between the beam delivery unit 2 and the spatial light modulator 31. Rays L1-L4 incident on the mirror elements SEa-SEd in the spatial light modulator 31, as shown in FIG. 5B, have respective uniform intensity distributions throughout their cross section and the intensity I equal to each other.

In this case, as shown in FIG. 5A, the rays L1 and L2 via the mirror elements SEa and SEb in the spatial light modulator 31 are superimposed in one unit region (divided region) on the pupil intensity distribution, thereby to obtain a light intensity distribution SP1 with an intensity level of a multiple of the minimum intensity (which is the intensity of the light intensity distribution SP3 or SP4 by the ray L3 or L4 incident via one mirror element SEc or SEd to one divided region).

Now, let us consider a situation in the above configuration (the configuration without the diffractive optical element 30 between the beam delivery unit 2 and the spatial light modulator 31) wherein a parallel light beam with a uniform intensity distribution and a square cross section is incident on the spatial light modulator 31 having four thousand mirror elements 31a and wherein a pupil intensity distribution of a circular shape centered on the optical axis AX is formed on the illumination pupil immediately behind the micro fly's eye lens 7. In this case, even if the number of divisions of the circular pupil intensity distribution (the number of pixels) is set to 32, intensity levels (gray levels) in each divided region (each pixel) of the pupil intensity distribution are only about four stages at most, as shown by formula (1) below. In addition, the intensity levels of the respective divided regions are integral multiples of the minimum intensity (one, two, or more times the minimum intensity).

$$4000/(32 \times 32 \times \pi/4) \approx 4.9 \quad (1)$$

Namely, in the case of the configuration using the spatial light modulator of a high durability type with a relatively small number of mirror elements, it is infeasible to ensure a required degree of freedom for the intensity levels of the respective divided regions of the pupil intensity distribution unless the number of divisions of the pupil intensity distribution is set smaller or unless the degree of freedom for the shape of the pupil intensity distribution is sacrificed. In another way, intensity levels of multiples of the minimum intensity (the intensity of the ray incident via one mirror element to one divided region) cannot be realized unless rays via a plurality of mirror elements are superimposed on one unit region (divided region) on the pupil intensity distribution; therefore, when the required degree of freedom is ensured for the intensity levels of the pupil intensity distribution, the number of divisions of the pupil intensity distribution becomes smaller and the degree of freedom for the shape of the pupil intensity distribution is reduced eventually. As a consequence, it is infeasible to achieve both of a high degree of freedom for the shape of the pupil intensity distribution and a high degree of freedom for the intensity levels of the pupil intensity distribution.

In the present embodiment, the reflection type diffractive optical element 30 is arranged in the optical path between the beam delivery unit 2 and the spatial light modulator 31. The diffractive optical element 30 functions to apply spatial light modulation to the incident light from the light source 1 and to make rays of intensity levels according to positions of the respective mirror elements, incident on the mirror elements 31a of the spatial light modulator 31. In a simple example, each of rays incident via the diffractive optical element 30 onto the respective mirror elements 31a has a uniform intensity distribution, and the intensity levels of the rays incident on the mirror elements 31a are discretely distributed. In other words, the rays incident via the diffractive optical element 30 onto the spatial light modulator 31 have a discontinuous intensity distribution across the cross section thereof, typically, an intensity distribution varying stepwise.

Figure 6A:
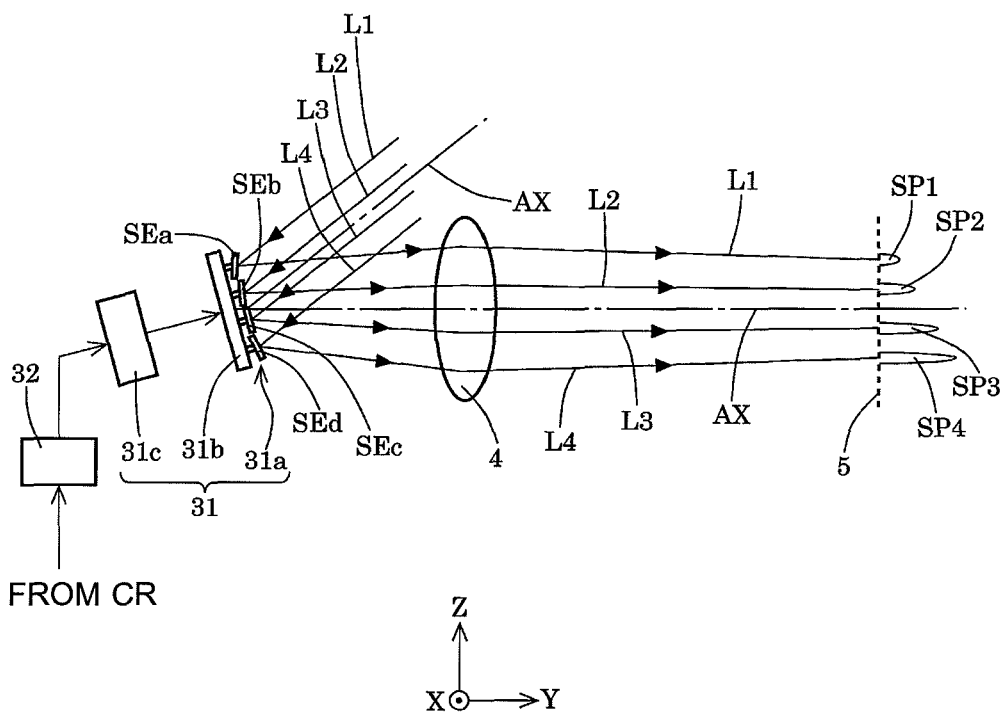
FIGS. 6A and 6B are exemplary drawings for explaining the action of the spatial light modulator in the configuration of the embodiment.
Figure 6B:
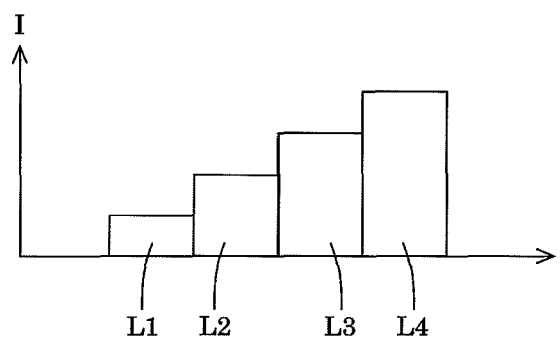

FIG. 6A is an exemplary drawing showing a state in which a pupil intensity distribution with a plurality of intensity levels is formed on the predetermined plane 5 being the far-field region (Fraunhofer diffraction region) of the spatial light modulator 31, in the configuration of the present embodiment wherein the reflection type diffractive optical element 30 is arranged in the optical path between the beam delivery unit 2 and the spatial light modulator 31. Each of the rays L1-L4 incident on the mirror elements 31a of the spatial light modulator 31, as shown in FIG. 6B, has a uniform intensity distribution across the cross section thereof, but their light intensities I are different from each other. In other words, the rays L1-L4 have a plurality of intensity levels distributed discretely.

As a consequence, even if the rays L1-L4 via the mirror elements SEa-SEd of the spatial light modulator 31 are made incident on mutually different unit regions (divided regions) on the pupil intensity distribution, the intensity levels of the rays L1-L4 arriving at the respective divided regions of the pupil intensity distribution formed on the predetermined plane 5 become values according to the intensity levels of the rays L1-L4 incident on the corresponding mirror elements SEa-SEd, as shown in FIG. 6A.

In the present embodiment, as described above, the control unit 32 individually controls the plurality of mirror elements 31a so that light via one mirror element 31a is incident on one divided region (unit region) on the pupil intensity distribution, for example, based on information about intensity levels of incident rays to the respective mirror elements 31a and information about the pupil intensity distribution. As a result, the intensity levels of the respective divided regions of the pupil intensity distribution become values according to the intensity levels of the incident rays on the corresponding mirror elements 31a and therefore the intensity levels of the respective divided regions of the pupil intensity distribution become distributed discretely. In addition, ratios of intensity levels of the respective divided regions to the minimum intensity can be varied in many ways. This means that a high degree of freedom for the intensity levels of the respective divided regions of the pupil intensity distribution is ensured even if the number of divisions of the pupil intensity distribution is set equal to the number of mirror elements 31a in the spatial light modulator 31 so as to ensure a high degree of freedom for the shape of the pupil intensity distribution.

As described above, the spatial light modulator unit 3 of the present embodiment is provided with the diffractive optical element 30 as a spatial light modulation element to apply the spatial light modulation to the incident light from the light source 1 and to make the rays of intensity levels according to the positions of the respective mirror elements, incident on the plurality of mirror elements 31a of the spatial light modulator 31. Therefore, the degree of freedom for the intensity levels of the pupil intensity distribution can be increased without decreasing the degree of freedom for the shape of the pupil intensity distribution, by individually controlling the plurality of mirror elements 31a on the basis of the information about the intensity levels of the rays incident on the respective mirror elements 31a. Particularly, in the present embodiment, the degree of freedom for the intensity levels of the pupil intensity distribution can be further increased by switching of the diffractive optical elements 30 with different diffraction properties with respect to the illumination optical path to change the discrete distribution of intensity levels of the rays incident on the mirror elements 31a.

The illumination optical system (2-10) of the present embodiment is able to realize highly-diverse illumination conditions, while increasing the degree of freedom for the intensity levels of the pupil intensity distribution, without decreasing the degree of freedom for the shape of the pupil intensity distribution formed on the illumination pupil immediately behind the micro fly's eye lens 7, using the spatial light modulator unit 3. Furthermore, the exposure device (2-WS) of the present embodiment is able to perform excellent exposure under an appropriate illumination condition realized according to the property of the pattern of the mask M to be transferred, using the illumination optical system (2-10) realizing the highly-diverse illumination conditions.

In the foregoing description, the operational effect of the present embodiment was described based on the example in which the intensity levels of the rays incident on the mirror elements 31a via the diffractive optical element 30 were discretely distributed, i.e., the example in which the rays incident via the diffractive optical element 30 onto the spatial light modulator 31 had the stepwise (discontinuously) varying intensity distribution. However, without having to be limited to this, an operational effect similar to that in the above embodiment can also be achieved even in the case where the rays incident via the diffractive optical element 30 onto the spatial light modulator 31 have the intensity distribution continuously (smoothly) varying across the cross section thereof, because a ray incident on each mirror element 31a has an approximately uniform intensity distribution and intensity levels of the rays incident on the mirror elements 31a are almost discretely distributed.

In the above description, the operational effect of the present embodiment was described based on the simple example in which the light via one mirror element 31a was made incident on one divided region (unit region) on the pupil intensity distribution. However, without having to be limited to this, it is needless to mention that rays via a plurality of mirror elements 31a may be superimposed on one divided region on the pupil intensity distribution as occasion demands.

In the above description, the spatial light modulator capable of individually controlling the orientations (angles: inclinations) of the reflecting faces arrayed two-dimensionally is used as a spatial light modulator with a plurality of mirror elements arrayed two-dimensionally and controlled individually. However, without having to be limited to this, it is also possible, for example, to use a spatial light modulator capable of individually controlling heights (positions) of the reflecting faces arrayed two-dimensionally. The spatial light modulator of this kind to be used can be selected from the spatial light modulators disclosed, for example, in U.S. Pat. No. 5,312,513 and in FIG. 1d in U.S. Pat. No. 6,885,493. In these spatial light modulators, a two-dimensional height distribution is formed whereby incident light is subjected to the same action as that of a diffractive surface. The aforementioned spatial light modulator with the plurality of reflecting faces arrayed two-dimensionally may be modified, for example, according to the disclosures in U.S. Pat. No. 6,891, 655, and in U.S. Patent Application Laid-Open No. 2005/ 0095749. corresponding thereto.

In the above embodiment the spatial light modulator 31 is provided with the plurality of mirror elements 31a arrayed two-dimensionally in the predetermined plane, but, without having to be limited to this, it is also possible to use a transmission type spatial light modulator with a plurality of transmissive optical elements arrayed in a predetermined plane and controlled individually.

In the above embodiment there is no optical system arranged in the optical path between the spatial light modulation element 30 and the spatial light modulator 31, but a relay optical system may be arranged in the optical path between them. This relay optical system may be a Fourier transform optical system which forms an optical Fourier transform plane of the plane where the spatial light modulation element 30 is arranged, on the spatial light modulator 31.

In the above embodiment the reflection type diffractive optical element 30 is used as a spatial light modulation element which applies spatial light modulation to the incident light from the light source 1 and which makes rays of intensity levels according to positions of the respective elements, incident on the mirror elements 31a. However, it is also possible to use a transmission type diffractive optical element, instead of the reflection type diffractive optical element 30.

Figure 7:
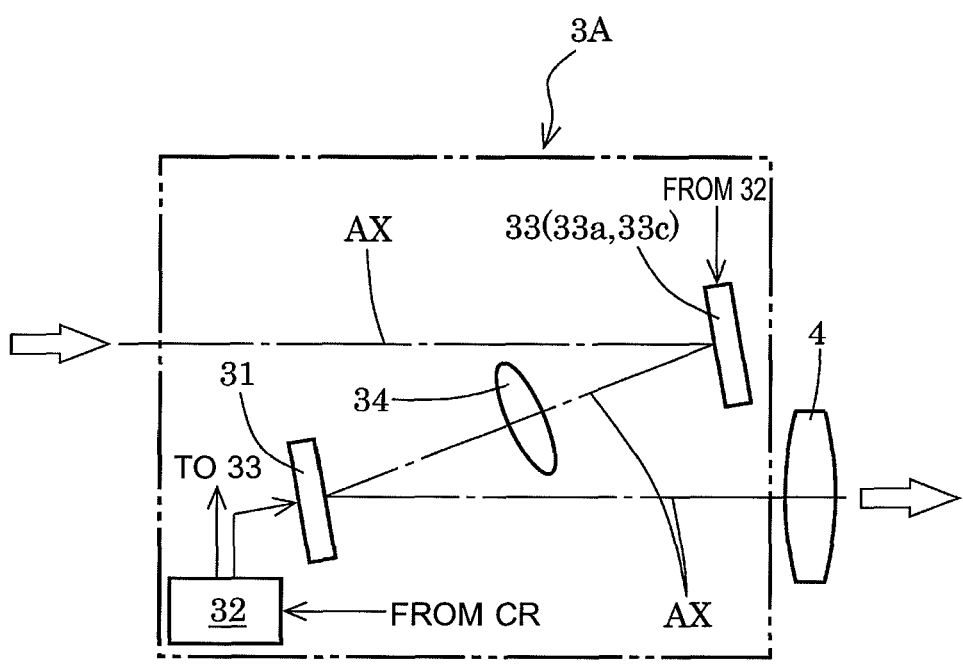
FIG. 7 is an exemplary drawing schematically showing an internal configuration of a spatial light modulator unit according to a first modification example.

It is also possible to adopt a configuration using a reflection type spatial light modulator 33 with a plurality of mirror elements 33a arrayed in a predetermined plane and controlled individually, instead of the reflection type diffractive optical element 30, as shown in FIG. 7. In a spatial light modulator unit 3A according to the first modification example of FIG. 7, the spatial light modulator 33 has the plurality of mirror elements 33a arrayed two-dimensionally, and a driving unit 33c to individually control and drive postures of the mirror elements, as in the case of the spatial light modulator 31. The driving unit 33c continuously or discretely changes orientations of the mirror elements 33a, based on a control signal from the control unit 32. A relay optical system 34 is arranged in the optical path between the spatial light modulator 33 and the spatial light modulator 31. This relay optical system 34 may be a Fourier transform optical system which forms an optical Fourier transform plane of the array plane where the plurality of mirror elements 33a of the spatial light modulator 33 are arrayed, on the spatial light modulator 31.

In the first modification example, light via one mirror element 33a in the spatial light modulator 33 is selectively incident via the relay optical system 34 onto a set of mirror elements 31a in the spatial light modulator 31. As a consequence, intensity levels of rays incident via the spatial light modulator 33 and the relay optical system 34 to the mirror elements 31a are discretely distributed and the rays incident on the spatial light modulator 31 have an intensity distribution stepwise varying across the cross section thereof.

In this manner, the postures of the mirror elements 33a in the spatial light modulator 33 are individually controlled to vary the discrete distribution of intensity levels of rays incident on the mirror elements 31a in the spatial light modulator 31, whereby it is feasible to achieve both of a high degree of freedom for the shape of the pupil intensity distribution and a high degree of freedom for the intensity levels of the pupil intensity distribution. In the first modification example the spatial light modulator 33 is provided with the mirror elements 33a arrayed two-dimensionally, but, without having to be limited to this, it is also possible to use a transmission type spatial light modulator with a plurality of transmissive optical elements arrayed in a predetermined plane and controlled individually.

Figure 8:
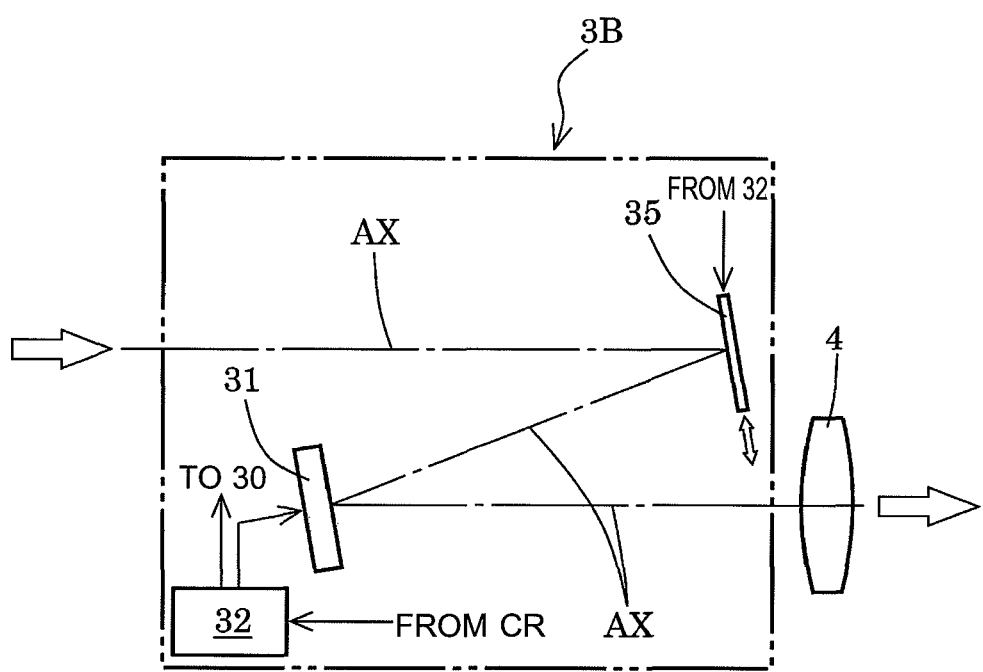
FIG. 8 is an exemplary drawing schematically showing an internal configuration of a spatial light modulator unit according to a second modification example.

It is also possible to adopt a configuration in which a filter 35 with a predetermined spatial reflectance distribution is used as the spatial light modulation element, as shown in FIG. 8. In a spatial light modulator unit 3B according to the second modification example of FIG. 8, the filter 35 is arranged, for example, so as to be optionally inserted into or retracted from the illumination optical path and so as to be replaceable with another filter with a different reflectance distribution (not shown). In the second modification example, as in the case of the aforementioned embodiment, intensity levels of rays incident via the filter 35 onto the mirror elements 31a are also discretely distributed and the rays incident on the spatial light modulator 31 have an intensity distribution varying stepwise across the cross section thereof.

In the second modification example, a plurality of filters 35 with different reflectance distributions may be switched from one to another with respect to the illumination optical path to change the discrete distribution of intensity levels of rays incident on the mirror elements 31a, whereby the degree of freedom for the intensity levels of the pupil intensity distribution can be further increased. The filter 35 with the predetermined spatial reflectance distribution is used in the second modification example, but, without having to be limited to this, it is also possible to use a filter with a predetermined spatial transmittance distribution.

Generally, the control method of the present embodiment is to make rays of discrete intensity levels incident on the respective optical elements of the spatial light modulator arranged in the optical path of the illumination optical system and individually control the optical elements on the basis of information about the discrete intensity levels. Furthermore, the control method of the present embodiment may be executed by a computer, using a control program to control drives of the optical elements in the spatial light modulator with the optical elements arrayed in the predetermined plane and controlled individually.

In the foregoing embodiment, the micro fly's eye lens 7 was used as an optical integrator, but an optical integrator of an internal reflection type (typically, a rod type integrator) may be used instead thereof. In this case, a condensing optical system for condensing the light from the predetermined plane 5 is arranged instead of the relay optical system 6. Then, instead of the micro fly's eye lens 7 and the condenser optical system 8, the rod type integrator is arranged so that an entrance end thereof is positioned at or near the rear focus position of the condensing optical system for condensing the light from the predetermined plane 5. At this time, an exit end of the rod type integrator is at the position of the mask blind 9. In the use of the rod type integrator, a position optically conjugate with the position of the aperture stop AS of the projection optical system PL, in the imaging optical system 10 downstream the rod type integrator can be called an illumination pupil plane. Since a virtual image of the secondary light source on the illumination pupil plane is formed at the position of the entrance plane of the rod type integrator, this position and positions optically conjugate therewith can also be called illumination pupil planes. The condensing optical system, the imaging optical system, and the rod type integrator can be regarded as a distribution forming optical system.

In the aforementioned embodiment, the mask can be replaced with a variable pattern forming device which forms a predetermined pattern on the basis of predetermined electronic data. Use of such a variable pattern forming device can minimize influence on synchronization accuracy even if the pattern surface is set vertical. The variable pattern forming device applicable herein can be, for example, a DMD (Digital Micromirror Device) including a plurality of reflective elements driven based on predetermined electronic data. The exposure device with the DMD is disclosed, for example, in Japanese Patent Application Laid-Open No. 2004-304135, U.S. Patent Application Laid-Open No. 2007/0296936. Besides the reflection type spatial light modulators of the non-emission type like the DMD, it is also possible to apply a transmission type spatial light modulator or a self-emission type image display device. The teachings of U.S. Patent Application Laid-Open No. 2007/0296936 are incorporated herein by reference.

The exposure device of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure device include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure device. After completion of the assembling blocks from the various sub-systems into the exposure device, overall adjustment is carried out to ensure various accuracies as the entire exposure device. The manufacture of the exposure device may be performed in a clean room in which the temperature, cleanliness, etc. are controlled.

Figure 9:
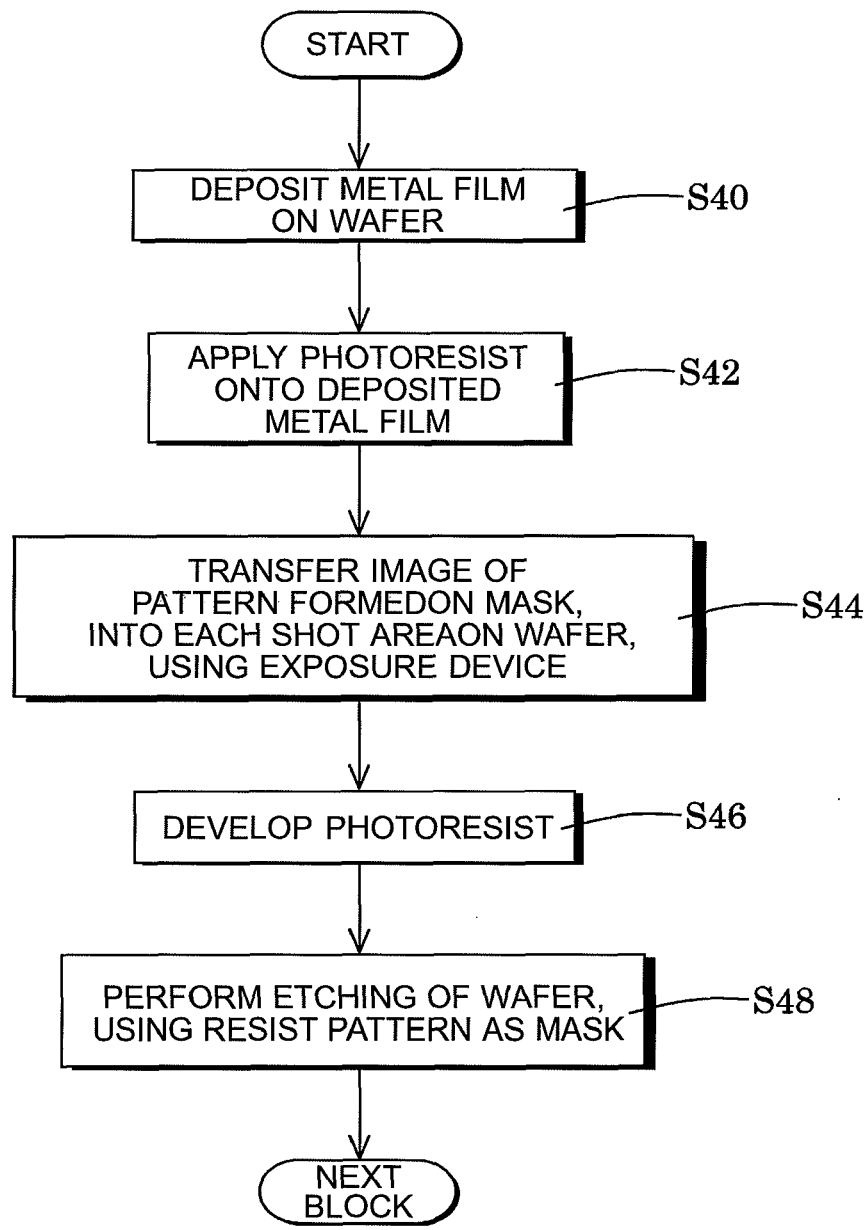
FIG. 9 is an exemplary flowchart showing manufacturing blocks of semiconductor devices.

The following will describe a device manufacturing method using the exposure device according to the above-described embodiment. FIG. 9 is an exemplary flowchart showing manufacturing blocks of semiconductor devices. As shown in FIG. 9, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the projection exposure device of the above embodiment (block S44: exposure block), and developing the wafer W after completion of the transfer, i.e., developing the photoresist on which the pattern is transferred (block S46: development block).

Thereafter, using the resist pattern made on the surface of the wafer W in block S46, as a mask, processing such as etching is carried out on the surface of the wafer W (block S48: processing block). The resist pattern herein is a photoresist layer in which depressions and projections are formed in a shape corresponding to the pattern transferred by the projection exposure device of the above embodiment and which the depressions penetrate throughout. Block S48 is to process the surface of the wafer W through this resist pattern. The processing carried out in block S48 includes, for example, at least either etching of the surface of the wafer W or deposition of a metal film or the like. In block S44, the projection exposure device of the above embodiment performs the transfer of the pattern onto the wafer W coated with the photoresist, as a photosensitive substrate or plate P.

Figure 10:
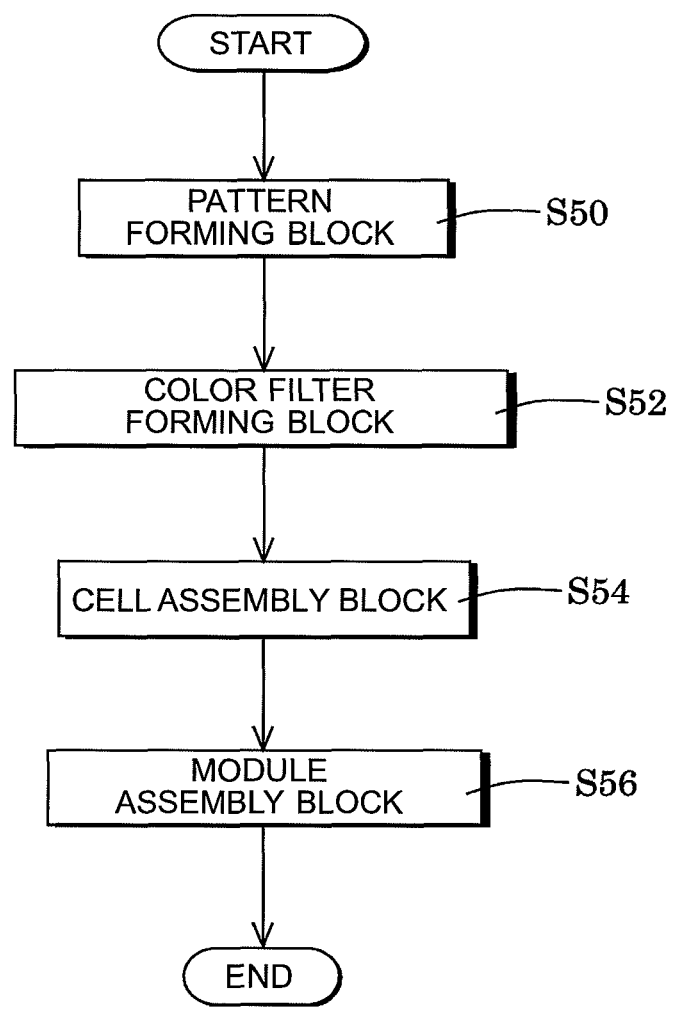
FIG. 10 is an exemplary flowchart showing manufacturing blocks of a liquid crystal device such as a liquid crystal display device.

FIG. 10 is an exemplary flowchart showing manufacturing blocks of a liquid crystal device such as a liquid crystal display device. As shown in FIG. 10, the manufacturing blocks of the liquid crystal device include sequentially performing a pattern forming block (block S50), a color filter forming block (block S52), a cell assembly block (block S54), and a module assembly block (block S56). The pattern forming block of block S50 is to form predetermined patterns such as a circuit pattern and an electrode pattern on a glass substrate coated with a photoresist, as a plate P, using the aforementioned projection exposure device of the above embodiment. This pattern forming block includes an exposure block of transferring a pattern to a photoresist layer, using the projection exposure device of the above embodiment, a development block of performing development of the plate P on which the pattern is transferred, i.e., development of the photoresist layer on the glass substrate, to form the photoresist layer in the shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction. The cell assembly block of block S54 is to assemble a liquid crystal panel (liquid crystal cell), using the glass substrate on which the predetermined pattern has been formed in block S50, and the color filter formed in block S52. Specifically, for example, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The present embodiment is not limited just to the application to the exposure devices for manufacture of semiconductor devices, but can also be widely applied, for example, to the exposure devices for display devices such as the liquid crystal display devices and plasma displays formed with rectangular glass plates, and to the exposure devices for manufacture of various devices such as imaging devices (CCDs and others), micro machines, thin film magnetic heads, and DNA chips. Furthermore, the present embodiment is also applicable to the exposure block (exposure device) for manufacture of masks (photomasks, reticles, etc.) on which mask patterns of various devices are formed, by the photolithography process.

The above-described embodiment uses the ArF excimer laser light (wavelength: 193 nm) or the KrF excimer laser light (wavelength: 248 nm) as the exposure light, but, without having to be limited to this, the present embodiment can also be applied to any other appropriate laser light source, e.g., an F2 laser light source which supplies laser light at the wavelength of 157 nm.

In the foregoing embodiment, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-Open No. 6-124873; the technique of forming a liquid bath of a predetermined depth on a stage and holding the substrate therein as disclosed in Japanese Patent Application Laid-Open No. 10-303114, and so on. The teachings of International Publication WO99/49504, Japanese Patent Application Laid-Open No. 6-124873, and Japanese Patent Application Laid-Open No. 10-303114 are incorporated herein by reference.

The foregoing embodiment was the application of the present embodiment to the illumination optical system for illuminating the mask (or the wafer) in the exposure device, but, without having to be limited to this, the present embodiment can also be applied to general illumination optical systems for illuminating an illumination target surface except for the mask (or the wafer).

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

What is claimed is:

1. A spatial light modulator unit which modulates an intensity distribution of light, the unit comprising:
    a spatial light modulator arranged in an optical path of the light, which deflects a first part of the light and a second part of the light in different directions;
    a lens element arranged in the optical path on an incidence side of the spatial light modulator; and
    a light intensity modulator arranged in the optical path on an incidence side of the lens element, which modulates the light so that intensities of the first and second part of the light are different from each other on the spatial light modulator via the lens element, wherein the lens element forms an optical Fourier transform plane of a plane where the light intensity modulator is located, and wherein the spatial light modulator is located approximately at the optical Fourier transform plane.

2. The spatial light modulator unit according to claim 1, wherein the light intensity modulator comprises a diffractive optical element.

3. The spatial light modulator unit according to claim 2, wherein the diffractive optical element is replaceable with another diffractive optical element having a different diffraction property.

4. The spatial light modulator unit according to claim 1, wherein the light intensity modulator comprises a plurality of optical elements arrayed along a predetermined plane, the plurality of optical elements being controllable individually.

5. The spatial light modulator unit according to claim 1, wherein the light intensity modulator comprises a plurality of mirror elements arrayed along the predetermined plane and a driving unit which controls posture of each of the mirror elements.

6. The spatial light modulator unit according to claim 5, wherein the driving unit continuously or discretely changes orientation of each of the mirror elements.

7. The spatial light modulator unit according to claim 1, wherein the light intensity modulator comprises a filter with a predetermined spatial transmittance distribution or with a predetermined spatial reflectance distribution.

8. The spatial light modulator unit according to claim 1, wherein the spatial light modulator comprises a plurality of mirror elements arrayed along a predetermined plane and a driving unit which controls posture of each of the mirror elements.

9. The spatial light modulator unit according to claim 8, wherein the driving unit continuously or discretely changes orientation of each of the mirror elements.

10. An illumination optical system which illuminates an illumination target surface with light, the system comprising:
an optical integrator arranged in an optical path of the light;
a lens system arranged in the optical path on an incidence side of the optical integrator; and
the spatial light modulator unit as set forth in claim 1 which is arranged in the optical path on an incidence side of the lens system and which forms a light intensity distribution on an illumination pupil of the illumination optical system via the lens system and the optical integrator.

11. An exposure device which exposes a photosensitive substrate to light via a predetermined pattern, the exposure device comprising the illumination optical system as set forth in claim 10 which illuminates the predetermined pattern with the light.

12. The exposure device according to claim 11, comprising:
a stage which holds the photosensitive substrate; and
a projection optical system which forms an image of the predetermined pattern illuminated with the light from the illumination optical system onto the photosensitive substrate on the stage.

13. The exposure device according to claim 12, comprising a measuring unit which measures a light intensity distribution on a pupil plane of the projection optical system by use of a monitor arranged approximately at a position optically conjugate with the pupil plane of the projection optical system.

14. The exposure device according to claim 13, comprising a controller which controls the spatial light modulator unit of the illumination optical system on the basis of a measuring result of the measuring unit to set the light intensity distribution on the pupil plane.

15. A device manufacturing method, comprising:
transforming a predetermined pattern onto a photosensitive substrate by exposing the photosensitive substrate with the exposure device as set forth in claim 11;
developing the photosensitive substrate on which the predetermined pattern is transferred, to form a mask layer in a shape corresponding to the predetermined pattern on a surface of the photosensitive substrate; and
processing the surface of the photosensitive substrate through the mask layer.

16. The illumination optical system according to claim 10, wherein the spatial light modulator of the spatial light modulator unit deflects a first part of the light and a second part of the light in different directions so that the first part of the light and the second part of the light pass through different positions on the illumination pupil.

17. The illumination optical system according to claim 10, wherein the light intensity modulator comprises a diffractive optical element.

18. The illumination optical system according to claim 17, wherein the diffractive optical element is replaceable with another diffractive optical element having a different diffraction property.

19. The illumination optical system according to claim 10, wherein the light intensity modulator comprises a plurality of optical elements arrayed along a predetermined plane, the plurality of optical elements being controllable individually.

20. The illumination optical system according to claim 10, wherein the light intensity modulator comprises a plurality of mirror elements arrayed along the predetermined plane and a driving unit which controls posture of each of the mirror elements.

21. The illumination optical system according to claim 10, wherein the spatial light modulator comprises a plurality of mirror elements arrayed along a predetermined plane and a driving unit which controls posture of each of the mirror elements.

22. The illumination optical system according to claim 10, wherein the lens system is arranged in the optical path so that the spatial light modulator of the spatial light modulator unit is located approximately at a front focal position of the lens system.

23. The illumination optical system according to claim 22, wherein the lens system is arranged in the optical path so that an entrance surface of the optical integrator is located approximately at a position optically conjugate with a rear focal position of the lens system.

24. The illumination optical system according to claim 10, wherein the optical integrator is arranged in the optical path so that a rear focal plane of the optical integrator is located approximately at the illumination pupil.

* * * * *